(12) United States Patent
Nakai

(10) Patent No.: US 8,101,967 B2
(45) Date of Patent: Jan. 24, 2012

(54) OPTICAL SEMICONDUCTOR PACKAGE AND OPTICAL SEMICONDUCTOR DEVICE

(75) Inventor: Hiroshi Nakai, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/024,582

(22) Filed: Feb. 10, 2011

(65) Prior Publication Data

US 2011/0220954 A1    Sep. 15, 2011

(30) Foreign Application Priority Data

Mar. 12, 2010  (JP) .................................. 2010-055196

(51) Int. Cl.
*H01L 33/00* (2010.01)
(52) U.S. Cl. ........................................ 257/99; 257/98
(58) Field of Classification Search ............ 257/98, 257/99
See application file for complete search history.

(56) References Cited

U.S. PATENT DOCUMENTS

| | | | | |
|---|---|---|---|---|
| 7,081,645 B2* | 7/2006 | Chen et al. | ...................... | 257/99 |
| 7,129,638 B2* | 10/2006 | Ng | ................. | 313/512 |
| 7,361,940 B2* | 4/2008 | Kim et al. | ...................... | 257/99 |
| 7,737,463 B2* | 6/2010 | Lee et al. | ........................ | 257/99 |
| 2008/0061314 A1* | 3/2008 | Liaw et al. | ...................... | 257/99 |

FOREIGN PATENT DOCUMENTS

JP      2008-185763       7/2001

* cited by examiner

*Primary Examiner* — Douglas Menz
(74) *Attorney, Agent, or Firm* — Hamre, Schumann, Mueller & Larson, P.C.

(57) ABSTRACT

Leads 3 and a metal block 2 are resin molded only in a region surrounded by a base bottom 1*d*, and the surface of the metal block 2 at the bottom of a cavity 10 is not composed of a resin but a metallic component or a material having high resistance to discoloration and degradation.

9 Claims, 4 Drawing Sheets

FIG. 6
| PROCESSING TIME(hours) | 0 | 48 | 120 | 1000 |
|---|---|---|---|---|
| RESIN REFLECTIVITY(%) | 87 | 84 | 81 | 59 |
| Ag REFLECTIVITY(%) | 90 | 84 | 82 | 73 |
| Au-Ag REFLECTIVITY(%) | 88 | 86 | 84 | 80 |
| GLASS CERAMIC REFLECTIVITY(%) | 93 | 92 | 92 | 91 |
FIG. 7
PRIOR ART
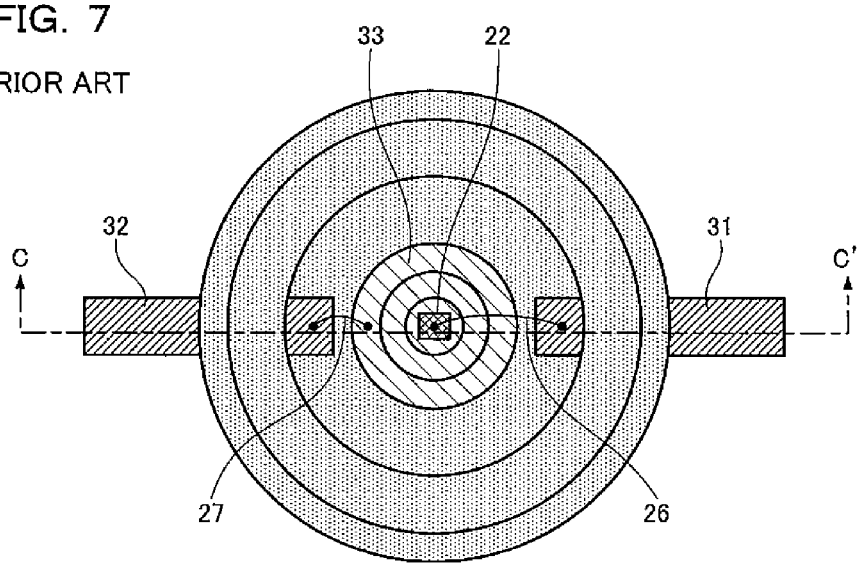
FIG. 8
PRIOR ART
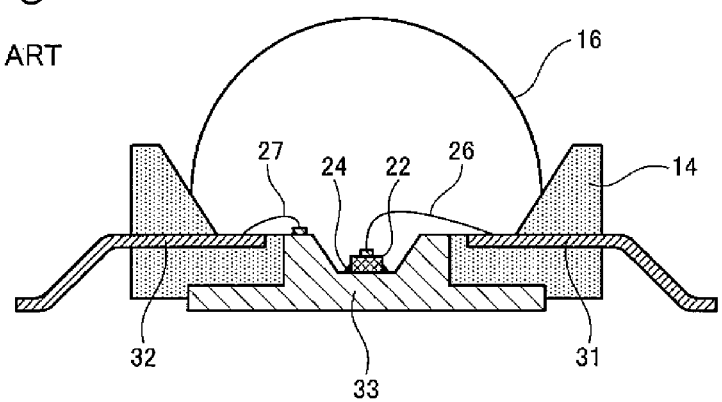

OPTICAL SEMICONDUCTOR PACKAGE AND OPTICAL SEMICONDUCTOR DEVICE

FIELD OF THE INVENTION

The present invention relates to an optical semiconductor package in which an optical semiconductor element such as an LED is mounted, and an optical semiconductor device using the optical semiconductor package.

BACKGROUND OF THE INVENTION

In a known optical semiconductor package for packaging an optical semiconductor element such as a light-emitting diode (LED), an element mounting part is provided for mounting the optical semiconductor element and leads are provided for electrically connecting the optical semiconductor element to an external circuit. The optical semiconductor element is mounted on the element mounting part of the optical semiconductor package and the optical semiconductor element and the leads are wire bonded and then are molded with a transparent resin, so that a semiconductor light emitting device is formed.

FIG. 7 is a top view showing the external structure of an optical semiconductor package according to the related art. FIG. 8 is a sectional view showing the structure of the optical semiconductor package according to the related art, taken along line C-C' of FIG. 7.

As shown in FIGS. 7 and 8, an optical semiconductor device having an optical semiconductor element mounted in the optical semiconductor package of the related art includes: a metal block 33 that has an optical semiconductor element 22 placed on an element mounting part on the major surface of the metal block 33 and is electrically connected to the optical semiconductor element 22 via a conductive adhesive 24; a lead 31 electrically connected to the optical semiconductor element 22 via a metal wire 26; a lead 32 electrically connected to the optical semiconductor element 22 through the metal block 33 by a metal wire 27; a light-transmissive member 16 that is made of a light-transmissive resin and covers the optical semiconductor element 22; and a base 14. The base 14 is made of a light-shielding resin. The bottom of the base 14 supports the inner leads of the leads 31 and 32 and the metal block 33, and the side of the base 14 supports the light-transmissive member 16. In this configuration, a region surrounded by the base 14, the inner leads, and the metal block 33 serves as a cavity region for mounting the optical semiconductor element 22. In the cavity region, the inner leads and the surface of the metal block 33 are coated with Ag to increase the reflectivity. In the optical semiconductor device of the related art, the metal block 33 has a backside region corresponding to a mounting region for mounting the optical semiconductor element 22 and the backside region penetrates the bottom of the base 14 and is exposed to the outside as a heat dissipation region (e.g., see Japanese Patent Laid-Open No. 2001-185763).

DISCLOSURE OF THE INVENTION

In the optical semiconductor package of the related art, however, the reflectivity and the mechanical strength are reduced by the degradation of the base 14 made of a light-shielding resin.

For example, in the light emitting device, the base 14 made of a light-shielding resin around the metal block 33 for mounting the optical semiconductor element 22 is damaged by light (particularly, ultraviolet radiation) emitted from the optical semiconductor element 22 and heat emitted from the optical semiconductor element 22 through the metal block 33. The light-shielding resin is typically a white thermoplastic resin having a high reflectivity. Because of external energy such as heat and ultraviolet radiation, a polymeric material becomes chemically unstable, a molecular structure causing discoloration is generated in the resin, and thus the resin mostly turns yellow. The discoloration of the light-shielding resin is concentrated in the bottom of the cavity which is most susceptible to direct light and heat from the optical semiconductor element 22. The discoloration reduces a reflectivity on the inner surface of the cavity and an amount of light emitted from the light emitting device.

The light-shielding resin is degraded by the influence of heat and ultraviolet radiation, a bonding strength between the base 14 and other components decreases, and the mechanical strength of the light-shielding resin also decreases, so that exfoliation, dropping, and so on of the light-shielding resin may cause a defective external shape.

In order to solve the problem, an object of an optical semiconductor package and an optical semiconductor device according to the present invention is to keep a reflectivity and a mechanical strength in the bottom of a cavity.

In order to attain the object, an optical semiconductor package of the present invention includes: a base including a ring and a ring-shaped base bottom formed under the ring, the base bottom being larger in internal diameter than the ring; leads each of which include an outer lead serving as an external electrode; at least one block that is provided in the base bottom and has a partially exposed top surface in the ring; an element mounting part provided as a region for mounting an optical semiconductor element on the surface of the block exposed in the ring; a lead placement part formed as a region for placing the leads on the top surface of the block with a step formed between the lead placement part and the element mounting part; a sealing material that seals and holds the block and the leads in the region of the base bottom; and a cavity as a region surrounded by the side of the ring and the top surface of the block, wherein at least the top surface of the block is made of an inorganic material having a reflectivity of at least 83% at a light wavelength of 460 nm, and only the top surface of the block is exposed in the bottom of the cavity.

Further, the overall block may be made of the inorganic material having a reflectivity of at least 83% at a light wavelength of 460 nm.

Preferably, the inorganic material having an average reflectivity of at least 83% at a wavelength of 460 nm is an Au—Ag alloy.

Preferably, the block has a back side such that the back side opposed to the top surface of the block is exposed from the sealing material.

The at least one block may include multiple blocks electrically isolated from each other.

The ring is preferably made of one of a ceramic and a glass-ceramic.

The ring is preferably composed of a highly-reflective glass-ceramic containing alumina of 50 mass % to 60 mass %.

The sealing material is preferably composed of one of a glass and a thermosetting resin.

An optical semiconductor device according to the present invention includes: the optical semiconductor package; the optical semiconductor element mounted on the element mounting part and electrically connected to the leads; and a light-transmissive resin for molding the inside of the cavity.

BRIEF DESCRIPTION OF THE DRAWINGS

FIG. 6 is an explanatory drawing showing reductions in the reflectivity of a cavity material used for the optical semiconductor package;

FIG. 7 is a top view showing the external structure of an optical semiconductor package according to the related art; and FIG. 8 is a sectional view showing the structure of the optical semiconductor package according to the related art.

DESCRIPTION OF THE EMBODIMENT

Figure 1:
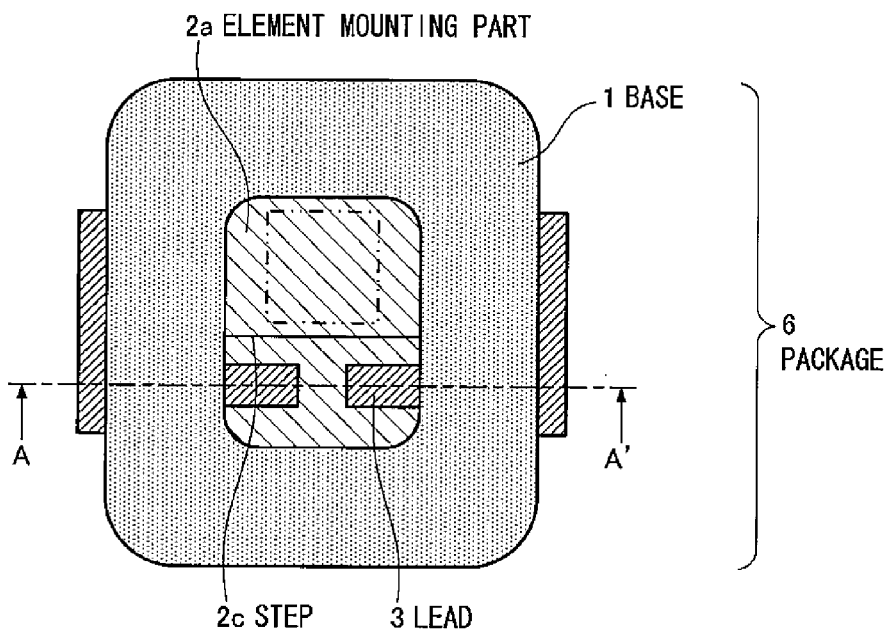
FIG. 1 is a top view showing a structural example of an optical semiconductor package according to the present invention.
Figure 2:
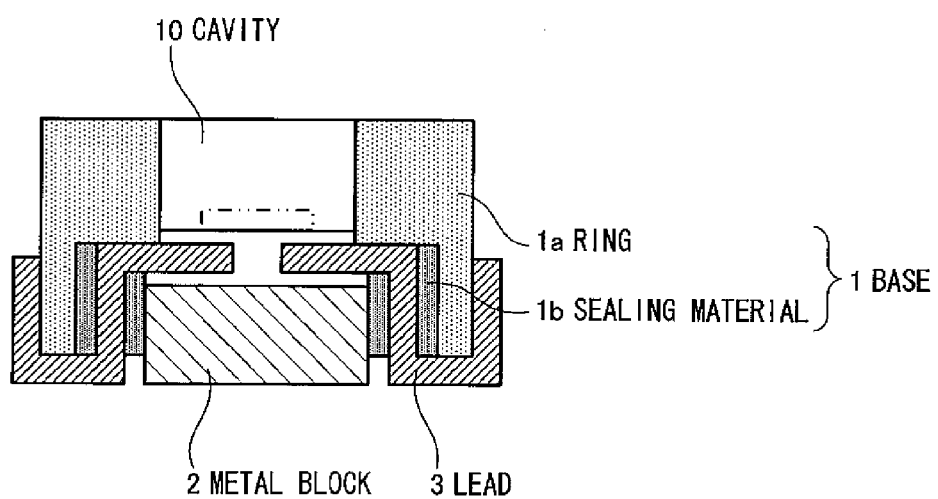
FIG. 2 is a sectional view showing the structural example of the optical semiconductor package according to the present invention.
Figure 3:
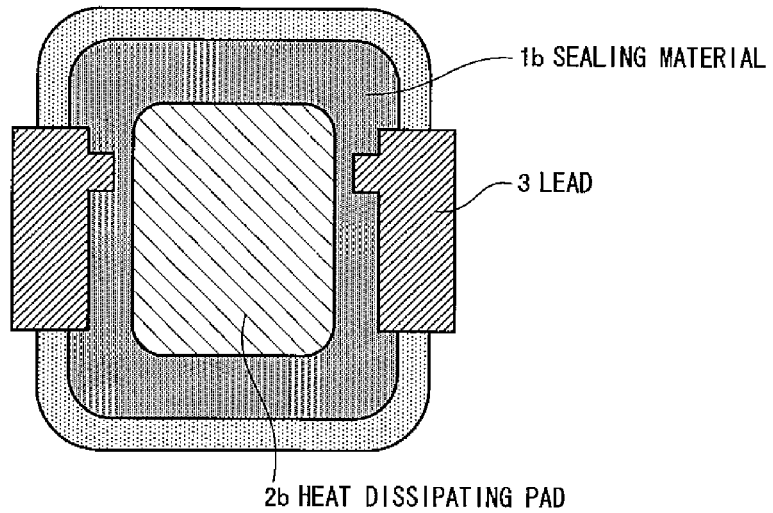
FIG. 3 is a back view showing the structural example of the optical semiconductor package according to the present invention.
Figure 4:
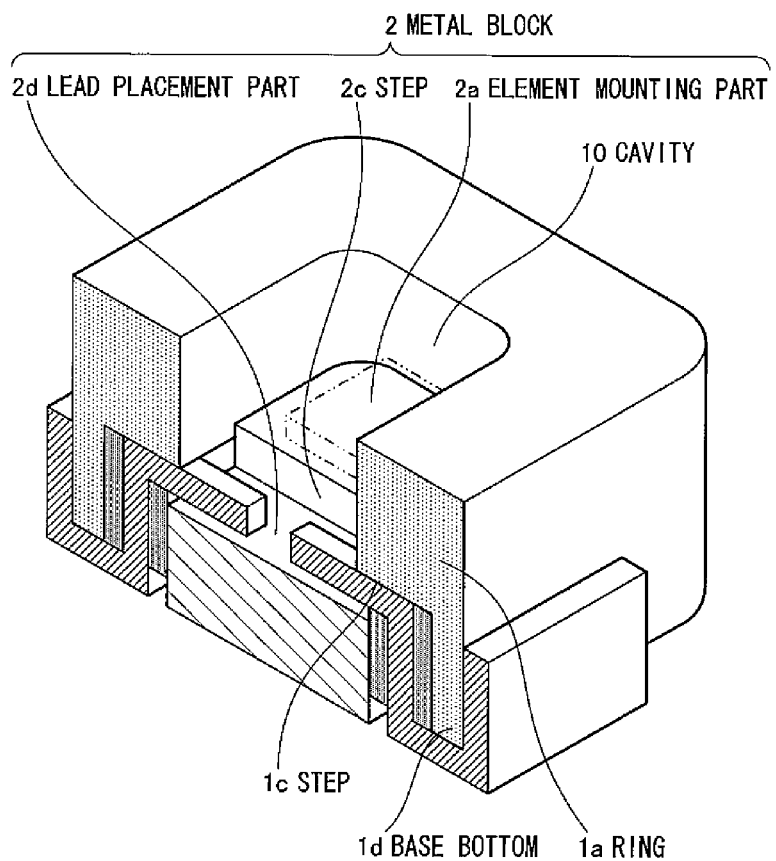
FIG. 4 is a sectional perspective view for explaining the configuration of a cavity in the optical semiconductor package of the present invention.
Figure 5A:
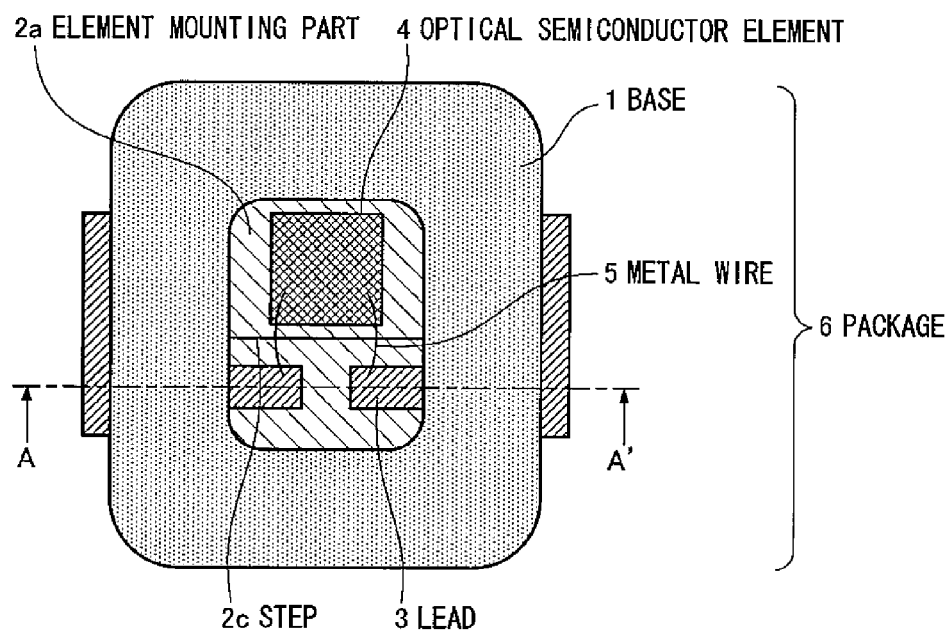
FIG. 5A shows the configuration of an optical semiconductor device according to the present invention.
Figure 5B:
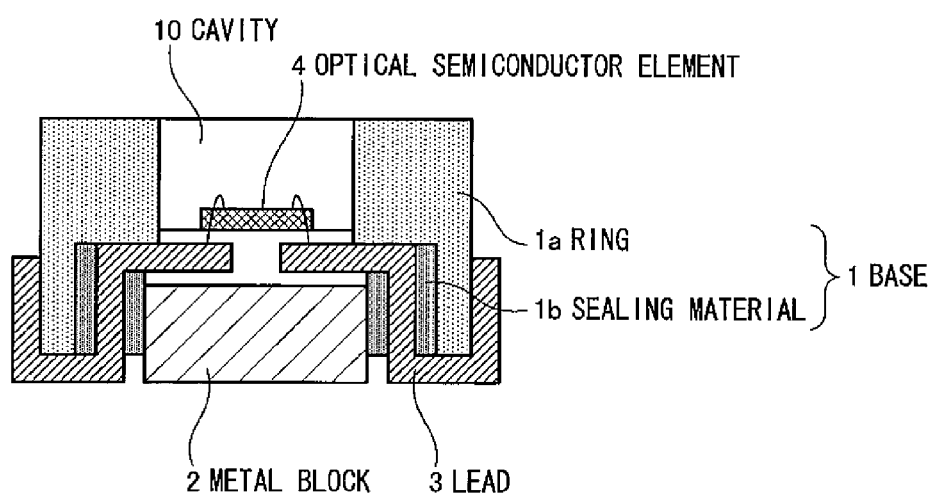
FIG. 5B shows the configuration of the optical semiconductor device according to the present invention.

FIG. 1 is a top view showing a structural example of an optical semiconductor package according to the present invention. FIG. 2 is a sectional view showing the structural example of the optical semiconductor package according to the present invention, taken along line A-A' of FIG. 1. FIG. 3 is a back view showing the structural example of the optical semiconductor package according to the present invention. FIG. 4 is a sectional perspective view for explaining the configuration of a cavity in the optical semiconductor package of the present invention. FIGS. 5A and 5B show the configuration of an optical semiconductor device according to the present invention. FIG. 5A is a top view and FIG. 5B is a sectional view taken along line A-A' of FIG. 5A.

As shown in FIGS. 1 to 3, an optical semiconductor package 6 (hereinafter, will be simply called a package 6) is made up of a base 1, a metal block 2, and leads 3. The base 1 is made up of a ring 1a having a step on the back side and a sealing material 1b joining the metal block 2 and the leads 3. The ring 1a and the sealing material 1b are both made of an insulating material. The stepped ring 1a forms a clearance to be filled with the sealing material 1b, without exposing the sealing material 1b on the inner surface of the cavity. The ring 1a is a ceramic ring or a glass-ceramic ring that is highly reflective and is not discolored by light or heat. The sealing material 1b is composed of a glass or a thermosetting resin that is highly resistant to heat. A glass-ceramic used for the ring 1a contains alumina. When the content of alumina is not larger than 50 mass %, the reflectivity decreases. When the content of alumina is not smaller than 60 mass %, the mechanical strength decreases. Thus the glass-ceramic used for the ring 1a preferably has an alumina content of 50 mass % to 60 mass %. The material of the ring 1a is not limited to glass-ceramics containing alumina. Any other materials may be used as long as the materials are highly reflective and are hardly discolored or degraded by light and heat. Moreover, the ring 1a constitutes only the side of the cavity and thus the ring 1a is not so affected by light and heat as the bottom of the cavity. For this reason, the ring 1a may be made of any materials as long as discoloration and deterioration can be suppressed under the influence of light and heat.

The metal block 2 includes an element mounting part 2a for mounting an optical semiconductor element, a heat dissipating pad 2b, and a step 2c forming a lower surface than the element mounting part 2a. The metal block 2 placed in the ring 1a is made of a metal such as an oxygen free copper that is highly thermally conductive.

The leads 3 are each subjected to bending press to be formed into predetermined shapes and are placed next to the ring 1a. The inner portions of the leads 3 are placed on the lower surface formed by the step 2c of the metal block 2. The step 2c is formed such that the leads 3 are not higher than the element mounting part 2a. Thus it is possible to prevent the leads 3 from blocking light from the optical semiconductor element.

The metal block 2 and the leads 3 are provided in the clearance formed by the step of the ring 1a, and the clearance of the ring 1a is filled with the sealing material 1b to hold the metal block 2 and the leads 3 in the clearance. The leads 3 are made of a metallic material and are connected via metal wires to the optical semiconductor element, e.g., an LED element mounted on the element mounting part 2a of the metal block 2. Further, the leads 3 are connected to an external circuit. The sealing material 1b fixes the metal block 2 and the leads 3 while electrically insulating the metal block 2 and the leads 3. The sealing material 1b is a thermosetting resin or a glass material and the ring 1a is made of a glass-ceramic material or a ceramic material.

Referring to FIG. 4, the configuration of the cavity will be specifically described below.

A cavity 10 has a region including the side of the ring 1a of the base 1 and the top surface of the metal block 2, the top surface containing the element mounting part 2a. Light emitted from the optical semiconductor element mounted in the cavity 10 is reflected in the cavity 10 and then the light is emitted out of the cavity 10, thereby improving the luminous efficiency of the optical semiconductor device.

As shown in FIG. 4, the base 1 is divided by a step 1c into the ring 1a that constitutes the cavity 10 and a ring-shaped base bottom 1d that is larger in internal diameter than the ring 1a. The mounting surface for the optical semiconductor element on the metal block 2 is exposed in the cavity 10, and the exposed surface is divided by the step 2c into the element mounting part 2a and a lead placement part 2d for placing the leads 3. The lead placement part 2d is lower than the element mounting part 2a. In a state in which the metal block 2 is mounted in the base 1, a clearance is provided between the step 1c and the lead placement part 2d and the leads 3 are placed in the clearance. Further, a region surrounded by the base bottom 1d is sealed with the sealing material 1b, so that the leads 3 and the metal block 2 are held by the sealing material 1b. In this configuration, a region surrounded by the ring 1a and the metal block 2 serves as the cavity 10.

In this case, the base bottom 1d of the base 1 makes it possible to seal the leads 3 in the region surrounded by the base bottom 1d. Thus it is not necessary to provide the sealing material 1b in the cavity 10, and only the metal block 2 is exposed in the bottom of the cavity 10. Although the bottom of the cavity 10 is susceptible to light and heat, the bottom is made of the metal that is hardly discolored or degraded by light and heat. Thus it is possible to suppress a reduction in light emission ratio and mechanical strength.

As shown in FIGS. 5A and 5B, an optical semiconductor element 4 is mounted on the element mounting part 2a of the optical semiconductor package according to the present invention, the optical semiconductor element 4 and the leads 3 are electrically connected via metal wires 5, and the inside of the cavity 10 is molded with a light-transmissive resin (not shown), so that the optical semiconductor device is formed.

The optical semiconductor device is formed thus by using the optical semiconductor package of the present invention, so that the bottom of the cavity 10 is made of the metal hardly discolored or degraded by light and heat, though the bottom is susceptible to light and heat. Hence, it is possible to suppress a reduction in light emission ratio and mechanical strength and thus achieve an optical semiconductor package and an optical semiconductor device in which an amount of light emission is hardly reduced by a decrease in reflectivity on the inner surface of the cavity and high reliability is obtained.

In a typical LED for lighting, a blue light source is converted to white light. Thus a reflectivity of an outgoing beam around 460 nm in the cavity is significant. FIG. 6 is an explanatory drawing showing reductions in the reflectivity of each cavity material used for the optical semiconductor package. FIG. 6 shows measured reflectivities of each cavity material used for an LED package.

As shown in FIG. 6, a white resin used in the related art has a reflectivity of 87% in the initial state relative to an outgoing beam having a wavelength of 460 nm. After an environmental test at 150° C., the reflectivity is reduced to 84% at 48 hours, 81% at 120 hours, and 60% or less at 1000 hours due to a thermal effect. In practical use, the reflectivity is further reduced by a thermal effect from the optical semiconductor element and resin degradation caused by light. Particularly, in the bottom of the cavity adjacent to the optical semiconductor element, the reflectivity is considerably reduced by discoloration. Moreover, an Ag coating applied to the inner leads and the surface of the metal block is also reduced in reflectivity, though the reduction is smaller than that of the white resin. The reflectivity is reduced by sulfuration on the surface of the Ag coating.

In the present invention, the ring 1a can be composed of an inorganic material by changing the position of the sealing material 1b, so that unlike on a resin material, serious discoloration or degradation does not occur. Typical inorganic materials have higher resistance to discoloration and degradation as compared with a resin material constituting the base of a semiconductor device of the related art. Thus by using, for the ring 1a, an inorganic material having a high light reflectivity and high resistance to discoloration and degradation, the reflectivity of light and the mechanical strength can be maintained. Particularly, the inorganic material preferably has a light reflectivity and resistance to discoloration and degradation as high as possible. The same effect can be obtained by performing surface treatment of Ag on the metal block 2 constituting the bottom of the cavity 10. By performing surface treatment of, e.g., an Au—Ag alloy having high resistance to discoloration, it is possible to further suppress a reduction in reflectivity. In the initial state, the reflectivity is 88%, which is lower than that of Ag. However, after an environmental test at 150° C., the reflectivity is only reduced to 86% at 48 hours, 84% at 120 hours, and 80% at 1000 hours by a thermal effect.

The cavity side is made of a glass-ceramic material which hardly decreases in reflectivity during the test.

In the foregoing explanation, the metal block 2 of the optical semiconductor package may be made of typical copper, a copper alloy such as a Cu—Fe alloy, and a clad metal containing copper or a copper alloy and may be surface-treated with, e.g., an Ag—Au alloy as long as high thermal conductivity and high resistance to degradation are obtained.

For heat dissipation from the optical semiconductor element 4, the metal block 2 including the element mounting part 2a is made of a copper material having a high thermal conductivity and the metal block 2 is protruded to the back side of the package, thereby preventing a temperature increase on the optical semiconductor element 4 and the bottom of the cavity 10. This effect can be enhanced by mounting the optical semiconductor package on a metal substrate made of, e.g., aluminum. Further, the exposed metal block 2 is substantially flush with the back side of the package, thereby favorably facilitating the mounting of the optical semiconductor package on the substrate.

The foregoing explanation described an example in which the overall metal block 2 is composed of a metal. Only the surface of the element mounting part 2a or the overall top surface containing the lead placement part 2d may be formed using an inorganic material that has a reflectivity of at least 83% at a light wavelength of 460 nm and has higher resistance to discoloration or degradation caused by light or heat as compared with a thermoplastic resin, and other regions may be made of any materials. In this case, when regions other than the surface of the metal block are made of a metal having a high thermal conductivity or a non-metal material, heat dissipation is favorably obtained at the same time. Alternatively, the overall metal block 2 may be made of a non-metal material having a high reflectivity of light and high resistance to discoloration or degradation caused by heat or light.

Although the leads are arranged along the side of the package in the drawings, the leads may be arranged in any forms. For example, connection terminals may be formed on the backside of the package or the leads may be shaped like gull wings. Moreover, any number of leads may be provided. Backside terminals may be provided on the optical semiconductor element and the back side of the optical semiconductor element may be electrically connected to the metal block. The metal block may act as an external terminal.

When multiple optical semiconductor elements 4 are mounted in a single package 6, multiple metal blocks 2 are provided so as to be electrically isolated from one another, achieving flexibility in an electric circuit configuration. For example, when electrodes are formed on the mounting surface (back side) and the light emitting surface (front side) of the optical semiconductor element, element mounting parts 2a are electrically insulated from each other, so that the optical semiconductor elements 4 can be also connected in series. Further, when two electrodes are formed on the mounting surface of the optical semiconductor element 4, the optical semiconductor element 4 can be mounted across the two metal blocks 2.

High durability, high heat dissipation, and high flexibility in circuit design are obtained thus. It is therefore possible to provide an optical semiconductor package and an optical semiconductor device with high reliability such that a reduction in the amount of light emission and a reduction in mechanical strength are smaller than those of the optical semiconductor package of the related art.

What is claimed is:

1. An optical semiconductor package comprising:
   a base including a ring and a ring-shaped base bottom formed under the ring, the base bottom being larger in internal diameter than the ring;
   leads each of which comprise an outer lead serving as an external electrode;
   at least one block that is provided in the base bottom and has a partially exposed top surface in the ring;
   an element mounting part provided as a region for mounting an optical semiconductor element on the surface of the block exposed in the ring;
   a lead placement part formed as a region for placing the leads on the top surface of the block with a step formed between the lead placement part and the element mounting part;
   a sealing material that seals and holds the block and the leads in a region of the base bottom; and a cavity as a region surrounded by a side of the ring and the top surface of the block, wherein at least the top surface of the block is made of an inorganic material having a reflectivity of at least 83% at a light wavelength of 460 nm, and only the top surface of the block is exposed in a bottom of the cavity.

2. The optical semiconductor package according to claim 1, wherein the overall block is made of the inorganic material having a reflectivity of at least 83% at a light wavelength of 460 nm.

3. The optical semiconductor package according to claim 1, wherein the inorganic material having a reflectivity of at least 83% at a light wavelength of 460 nm is an Au—Ag alloy.

4. The optical semiconductor package according to claim 1, wherein the block has a back side such that the back side opposed to the top surface of the block is exposed from the sealing material.

5. The optical semiconductor package according to claim 1, wherein the at least one block comprises multiple blocks electrically isolated from each other.

6. The optical semiconductor package according to claim 1, wherein the ring is made of one of a ceramic and a glass-ceramic.

7. The optical semiconductor package according to claim 1, wherein the ring is composed of a highly-reflective glass-ceramic containing alumina of 50 mass % to 60 mass %.

8. The optical semiconductor package according to claim 1, wherein the sealing material is composed of one of a glass and a thermosetting resin.

9. An optical semiconductor device comprising:
   the optical semiconductor package according to claim 1;
   the optical semiconductor element mounted on the element mounting part and electrically connected to the leads; and
   a light-transmissive resin for molding an inside of the cavity.

* * * * *